US011402438B2

(12) United States Patent
Zheng et al.

(10) Patent No.: US 11,402,438 B2
(45) Date of Patent: Aug. 2, 2022

(54) INTELLIGENT ON-LINE DIAGNOSIS AND POSITIONING METHOD FOR WINDING DEFORMATION OF POWER TRANSFORMERS

(71) Applicants: State Grid Zhejiang Electric Power Company Limited Electric Power Research Institute, Zhejiang (CN); Hangzhou KELIN Electric CO., Ltd, Hangzhou (CN)

(72) Inventors: Yiming Zheng, Zhejiang (CN); Wenhao Wang, Zhejiang (CN); Jialong Xu, Zhejiang (CN); Zhongsheng Hua, Zhejiang (CN); Wei Du, Zhejiang (CN); Yiyong Zhu, Zhejiang (CN); Yifan He, Zhejiang (CN); Bingxiao Mei, Zhejiang (CN); Zemin Wei, Zhejiang (CN); Qiaoqun Xia, Zhejiang (CN); Tieying Tang, Zhejiang (CN); Daolin Lan, Zhejiang (CN); Xixing Hu, Zhejiang (CN)

(73) Assignees: State Grid Zhejiang Electric Power Company Limited Electric Power Research Institute, Zhejiang (CN); Hangzhou Kelin Electric Co., Ltd, Zhejiang (CN)

( * ) Notice: Subject to any disclaimer, the term of this patent is extended or adjusted under 35 U.S.C. 154(b) by 471 days.

(21) Appl. No.: 16/553,665

(22) Filed: Aug. 28, 2019

(65) Prior Publication Data
US 2020/0241066 A1 Jul. 30, 2020

(30) Foreign Application Priority Data

Jan. 30, 2019 (CN) .......................... 201910091394.9

(51) Int. Cl.
*G01R 31/06* (2006.01)
*G01R 31/72* (2020.01)
(Continued)

(52) U.S. Cl.
CPC ............... *G01R 31/72* (2020.01); *G01R 1/28* (2013.01); *G01R 31/1227* (2013.01);
(Continued)

(58) Field of Classification Search
CPC .......... G01R 31/72; G01R 1/28; G01R 31/62; G01R 31/1227; G01R 35/02;
(Continued)

(56) References Cited

U.S. PATENT DOCUMENTS

2013/0132001 A1\* 5/2013 Yacout ..................... G01D 3/10
702/35
2014/0039817 A1\* 2/2014 Dayan .................... G01R 31/00
702/58

(Continued)

*Primary Examiner* — Raul J Rios Russo
(74) *Attorney, Agent, or Firm* — Muncy, Geissler, Olds & Lowe, P.C.

(57) ABSTRACT

Disclosed is an intelligent on-line diagnosis method for winding deformation of power transformer. When a transformer is subjected to short-circuit shock or transportation collision, transformer windings may undergo local twisting, swelling or the like under the action of an electric power or mechanical force, which is called winding deformation and will cause a huge hidden danger to the safe operation of the power network. Commonly used diagnosis methods for winding deformation are all off-line diagnosis methods, which have the disadvantages that transformers need to be shut down and highly skilled operators are required. The present invention provide an intelligent on-line diagnosis method for winding deformation on the basis of combination of information entropy and support vector machine. By carrying out feature extraction of current and voltage signals based on permutation entropy and wavelet entropy, integrat- (Continued)

ing the variation of the monitoring indicators of the power transformers in complexity, time-frequency domain and the like and automatically learning the diagnostic logic from fault features through the machine learning algorithm, intelligent diagnosis of winding deformation is realized, thereby reducing labor costs and improving diagnosis efficiency.

7 Claims, 4 Drawing Sheets

(51) Int. Cl.
| | |
|---|---|
| *G06N 20/10* | (2019.01) |
| *G01R 1/28* | (2006.01) |
| *G01R 31/62* | (2020.01) |
| *G01R 31/12* | (2020.01) |
| *G01R 35/02* | (2006.01) |
| *H01F 30/12* | (2006.01) |
| *G01R 31/34* | (2020.01) |
| *G01R 31/52* | (2020.01) |

(52) U.S. Cl.
CPC ............. *G01R 31/62* (2020.01); *G01R 35/02* (2013.01); *G06N 20/10* (2019.01); *G01R 31/12* (2013.01); *G01R 31/346* (2013.01); *G01R 31/52* (2020.01); *H01F 30/12* (2013.01)

(58) Field of Classification Search
CPC ...... G01R 31/346; G01R 31/12; G01R 31/52; G06N 20/10; H01F 30/12; H01F 27/402
USPC ................ 324/340, 361, 500, 537, 546, 547
See application file for complete search history.

(56) References Cited

U.S. PATENT DOCUMENTS

2020/0103894 A1* 4/2020 Cella .................. G05B 23/0283
2020/0200813 A1* 6/2020 Hua ....................... G01R 31/62
2021/0048487 A1* 2/2021 He .......................... G06F 17/14

* cited by examiner

INTELLIGENT ON-LINE DIAGNOSIS AND POSITIONING METHOD FOR WINDING DEFORMATION OF POWER TRANSFORMERS

TECHNICAL FIELD

The present invention belongs to the field of state monitoring and state diagnosis of power transformers, and in particular to an intelligent on-line diagnosis and positioning method for winding deformation of power transformers.

BACKGROUND ART

Transformer is one of the main equipment of a power system, and it plays a pivotal role of grid interconnection and power conversion. When the transformer is subjected to short-circuit shock or transportation collision, transformer windings may undergo axial or radial dimensional changes under the action of an electric power or mechanical force, which is called winding deformation. Severe winding deformation will lead to insulation breakdown, causing power system accidents and huge economic and social losses. The difficulty in the winding deformation problem of power transformers lies in that the winding deformation has the characteristics of concealment and gradual development. If winding deformation has not been repaired for a long time, it will be intensified and the short-circuit resistance will be reduced until the power transformers are completely damaged.

At present, the diagnosis for winding deformation of power transformers is based on the results of power outage tests. There is no complete and scientific on-line diagnosis method for winding deformation of power transformers. Commonly used diagnosis methods for winding deformation include a frequency response method, a low voltage short circuit impedance test method and a winding dielectric loss capacitance test method. The above three methods are widely used, but they are all off-line diagnosis methods subject to power outage tests. The off-line diagnosis methods have three disadvantages: First, a power outage is required during the test. In some cases, due to the requirements of system operation, equipment can not be powered off, often resulting in test missing or over-period testing. This makes it difficult to diagnose fault defects in time. Second, the test interval is too long. The test period is generally one year, and some of the faster-developing faults can easily develop into accidents within a time interval between two specified tests. Finally, test works are carried out intensively, the workload is large, and highly skilled operators are required, which results in a large amount of labor costs.

SUMMARY OF THE INVENTION

The technical problem to be solved by the present invention is to overcome the above-mentioned shortcomings of the prior art, and provide an intelligent method for on line diagnosing winding deformation of power transformers by using voltage and current monitoring data, so as to achieve the objective of on-line diagnosis of winding deformation, and the auxiliary maintenance personnel can simply, rapidly and accurately determine whether transformer windings are deformed and where the deformation occurs, without interference with the normal operation of the power grid, thereby improving the efficiency of maintenance work, saving manpower and material resources, and ensuring safe and stable operation of the power grid.

Therefore, the present invention adopts the following technical solution: an intelligent on-line diagnosis and positioning method for winding deformation of power transformers, comprising the following steps:

Step 1: dividing on-line monitoring indicators of each of n known transformers at deformation positions according to a three-phase three-winding pattern into 9 position subsamples as modeling samples for positioning diagnosis;

Step 2: calculating root-mean-square errors of normalized permutation entropy, wavelet entropy and average of subordinate monitoring indicators of the 9n position subsamples in two sequences before and after the last short circuit to construct features sets;

Step 3: adding to the feature set of each of the 9n position subsamples a tag indicating whether deformation occurs and then inputting into an SVM (Support Vector Machine) model for classification learning to obtain a trained SVM model;

Step 4: carrying out hierarchical cross-validation to determine the accuracy, precision, and recall of diagnosis results of the model; and Step 5: in the case of determining the deformation positioning of a sample to be tested, first carrying out an on-line winding deformation diagnosis method to conclude that the transformer to be tested is deformed, and then dividing on-line monitoring indicators of the transformer to be tested according to a three-phase three-winding pattern into 9 position subsamples, calculating a feature set in the same way as in step 2, inputting the feature set into the trained SVM model, and outputting a diagnosis result of the SVM model for each position subsample.

According to the present invention, based on the combination of information entropies and a support vector machine algorithm, features are extracted from voltage and current monitoring data of power transformers and used for learning, and finally the intelligent on-line diagnosis and positioning method for winding deformation of power transformers is realized.

As a supplement to the above-described method, in step 1, the 9 positions are high-voltage phase A, high-voltage phase B, high-voltage phase C, medium-voltage phase A, medium-voltage phase B, medium-voltage phase C, low-voltage phase A, low-voltage phase B and low-voltage phase C, respectively.

As a supplement to the above-described method, in the step 1, the on-line monitoring indicators include voltage and current monitoring data and 12 new phase difference indicators constructed by a three-phase unbalance rate, totaling 30 indicators;

With respect to the phase difference indicators, as an example, the current and voltage phase differences at a low-voltage side are calculated according to the formulas as follows, and the current and voltage phase differences at a medium-voltage side and a high-voltage side are calculated in the same way:

current difference between low-voltage phases $A$ and $B$=current amplitude of low-voltage phase $B$−current amplitude of low-voltage phase $A$, current difference between low-voltage phases $B$ and $C$=current amplitude of low-voltage phase $C$−current amplitude of low-voltage phase $B$, voltage difference between low-voltage phases $A$ and $B$=voltage amplitude of low-voltage phase $B$−voltage voltage of low-voltage phase $A$, and voltage difference between low-voltage phases $B$ and $C$=voltage amplitude of low-voltage phase $C$−voltage amplitude of low-voltage phase $B$.

As a supplement to the above method, the permutation entropy in the step 2 is calculated in a way that a phase space reconstruction delay coordinate method is employed to reconstruct the phase space of any one element x(i) in a one-dimensional time sequence x to obtain the following matrix:

$$\begin{bmatrix} x(1) & x(1+\tau) & \ldots & x(1+(m-1)\tau) \\ \ldots & \ldots & \ldots & \ldots \\ x(j) & x(j+\tau) & \ldots & x(j+(m-1)\tau) \\ \ldots & \ldots & \ldots & \ldots \\ x(K) & x(K+\tau) & \ldots & x(K+(m-1)\tau) \end{bmatrix}$$

In the formula, m is an embedding dimension, $\tau$ is delay time; the elements of the reconstructed vector of x(i) are arranged in ascending order, $j_1, j_2, \ldots, j_m$; and at most m! different arrangement patterns are obtained under the m-dimension phase space mapping, one of the arrangement patterns is represented by P(l), $$P(l) = (j_1, j_2, \ldots, j_m),$$

then, the number of occurrence of the various arrangements of the sequence x are then counted to calculate the relative frequency $P_i$ of each arrangement:

$$P_i = \frac{\text{the number of } P(l)}{k},$$

then, the entropy of a signal arrangement pattern is expressed as:

$$H = -\Sigma_{i=1}^{k} P_i \ln P_i,$$

and then the normalized permutation entropy is expressed as:

$$H(m, \tau) = \frac{\left(-\sum_{i=1}^{k} P_i \ln P_i\right)}{\ln(m!)}.$$

As a supplement to the above-described method, the wavelet entropy in the step 2 is calculated by the algorithm in which a signal f(n) is continuously subdivided through different filters and decomposed into sub-signals at different measures (M), including a series of frequency binary division based high-frequency detail sub-band signals $D_1$, $D_2, \ldots, D_M$ and a low-frequency approximation sub-band signal $A_M(n)$; after the wavelet decomposition of the signal, the wavelet energy $E_1, E_2, \ldots, E_n$ in each frequency band (i=1, 2, . . . ; n) can be obtained; based on energy conservation before and after wavelet transform, the total power E of the signal in a certain time window is equal to the sum of component powers; the total energy entropy is equal to the sum of information entropy of the relative energy $e_i$ of the wavelets in each frequency band:

$$H = -\Sigma e_i \ln e_i.$$

As a supplement to the above-described method, the root-mean-square errors of the permutation entropy, the wavelet entropy and the average described in the step 2 are $RMSE_{PE}$, $RMSE_{WE}$ and $RMSE_{AVG}$, the calculation process thereof is described by taking permutation entropy as an example: the sums of the squares of the entropy differences of all monitoring indicators are calculated and then the square root of the average value of sums of the squares is calculated to obtain the root-mean-square error of permutation entropy ($RMSE_{PE}$) of the transform before and after the last short circuit.

As a supplement to the above-described method, the on-line diagnosis method for winding deformation described in the step 5 comprises the following steps:

Step a: carrying out a subtraction operation between voltage and current monitoring data of sample transformers and current and voltage monitoring data of all phases existing in modeling samples to construct current phase differences and voltage phase differences and adding the current phase differences and the voltage phase differences as new indicators to indicators;

Step b: dividing the on-line monitoring data of the modeling samples into two sequences: for transformers that have been subjected to short circuit, dividing the on-line monitoring data into two sequences before and after the short circuit according to the time of the last short circuit; for transformers that have not been subjected to short circuit, equally dividing the sequence into a first half and a second half.

Step c: calculating root-mean-square errors of permutation entropy, wavelet entropy, and average of the monitoring indicators of the modeling samples in the first and second sequences;

Step d: adding a tag to each of feature sets of the modeling samples and inputting into an SVM model for classification learning to obtain a trained SVM model;

Step e: carrying out hierarchical cross-validation to determine the accuracy, precision, and recall of diagnosis results of the SVM model; and Step f: calculating a feature set of each sample to be tested by using the same feature extraction method, inputting into the trained SVM model, and outputting a diagnosis result of the model for each transformer to be tested.

According to the present invention, permutation entropy and wavelet entropy are used to perform feature extraction of the signal, and whether a transformer is deformed is diagnosed on the basis of the support vector machine. The present invention has the advantages that the intelligent diagnosis is achieved on the basis of the machine learning algorithm by integrating the variation of the monitoring indicators of the transformer in complexity, time-frequency domain and the like.

DETAILED DESCRIPTION

The present invention will be further described below with reference to the accompanying drawings of the specification and specific embodiments.

Embodiment

Figure 1:
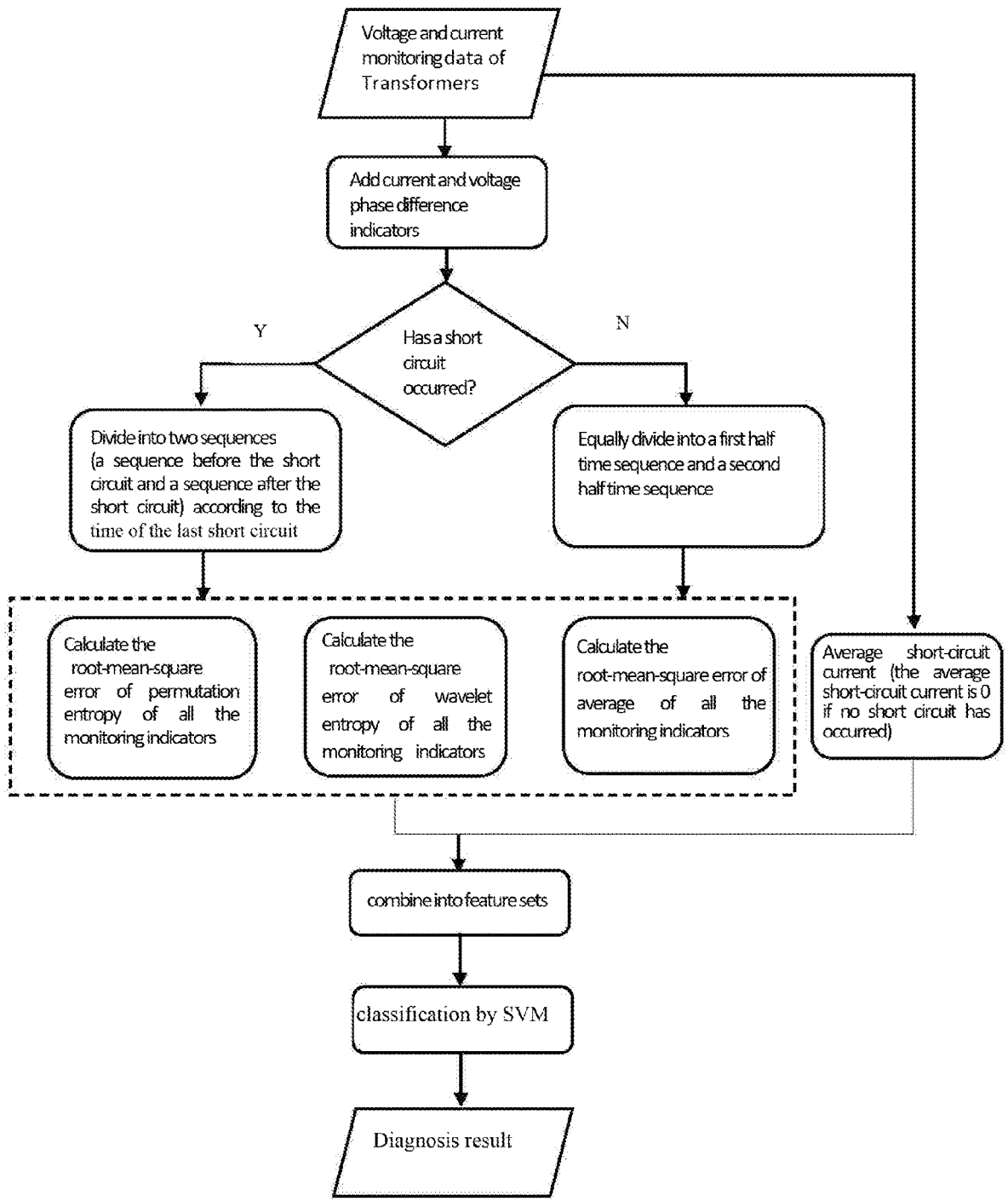
FIG. 1 is a flowchart of the present invention.

An intelligent on-line diagnosis and positioning method for winding deformation of power transformers, as shown in FIG. 1, comprises the following steps:

Step 1, on-line monitoring indicators of each of n known transformers at deformation positions are divided according to a three-phase three-winding pattern into 9 position subsamples (high-voltage phase A, high-voltage phase B, high-voltage phase C, medium-voltage phase A, medium-voltage phase B, medium-voltage phase C, low-voltage phase A, low-voltage phase B and low-voltage phase C) as modeling samples for positioning diagnosis.

Step 2, root-mean-square errors of normalized permutation entropy, wavelet entropy and average of subordinate monitoring indicators of the 9n position subsamples in two sequences before and after the last short circuit are calculated to construct features sets.

Step 3: the feature set of each of the 9n position subsamples is added with a tag indicating whether deformation occurs and then input into an SVM (Support Vector Machine) model for classification learning.

Step 4, hierarchical cross-validation is employed to determine the accuracy, precision, and recall of diagnosis results of the model.

Step 5, in the case of determining the deformation position of a sample to be tested, an on-line winding deformation diagnosis method is first employed to conclude that the transformer to be tested is deformed, and then on-line monitoring indicators of the transformer to be tested is divided according to a three-phase three-winding pattern into 9 position subsamples, a feature set is calculated in the same way and input into the trained SVM model, and a diagnosis result of the SVM model for each position subsample is output.

Further, in the step 1, the on-line monitoring indicators include voltage and current monitoring data and 12 new phase difference indicators constructed by a three-phase unbalance rate, totaling 30 indicators. With respect to the phase differences, as an example, the current and voltage phase differences at a low-voltage side are calculated according to the formulas as follows, and the current and voltage phase differences at a medium-voltage side and a high-voltage side are calculated in the same way:

current difference between low-voltage phases $A$ and $B$=current amplitude of low-voltage phase $B$–current amplitude of low-voltage phase $A$, current difference between low-voltage phases $B$ and $C$=current amplitude of low-voltage phase $C$–current amplitude of low-voltage phase $B$, voltage difference between low-voltage phases $A$ and $B$=voltage amplitude of low-voltage phase $B$–voltage voltage of low-voltage phase $A$, and voltage difference between low-voltage phases $B$ and $C$=voltage amplitude of low-voltage phase $C$–voltage amplitude of low-voltage phase $B$.

Further, the permutation entropy in the step 2 is calculated in a way that a phase space reconstruction delay coordinate method is employed to reconstruct the phase space of any one element $x(i)$ in a one-dimensional time sequence x to obtain the following matrix:

$$\begin{bmatrix} x(1) & x(1+\tau) & \ldots & x(1+(m-1)\tau) \\ \ldots & \ldots & \ldots & \ldots \\ x(j) & x(j+\tau) & \ldots & x(j+(m-1)\tau) \\ \ldots & \ldots & \ldots & \ldots \\ x(K) & x(K+\tau) & \ldots & x(K+(m-1)\tau) \end{bmatrix}$$

In the formula, m is an embedding dimension, $\tau$ is delay time; the elements of the reconstructed vector of x(i) are arranged in ascending order, $j_1, j_2, \ldots, j_m$; and at most m! different arrangement patterns are obtained under the m-dimension phase space mapping, one of the arrangement patterns is represented by P(l), $$P(l)=(j_1, j_2, \ldots, j_m),$$

then, the number of occurrence of the various arrangements of the sequence x are then counted to calculate the relative frequency $P_i$ of each arrangement:

$$P_i = \frac{\text{the number of } P(l)}{k},$$

then, the entropy of a signal arrangement pattern is expressed as:

$$H = -\Sigma_{i=1}^{k} P_i \ln P_i$$

and then the normalized permutation entropy is:

$$H(m, \tau) = \frac{\left(-\sum_{i=1}^{k} P_i \ln P_i\right)}{\ln(m!)}.$$

Further, the wavelet entropy in the step 2 is calculated by the algorithm in which a signal f(n) is continuously subdivided through different filters and decomposed into subsignals at different measures (M), including a series of frequency binary division based high-frequency detail subband signals $D_1, D_2, \ldots, D_M$ and a low-frequency approximation sub-band signal $A_M(n)$; after the wavelet decomposition of the signal, the wavelet energy $E_1, E_2, \ldots, E_n$ in each frequency band (i=1, 2, . . . ; n) can be obtained; based on energy conservation before and after wavelet transform, the total power E of the signal in a certain time window is equal to the sum of component powers Ei; the total energy entropy is equal to the sum of information entropy of the relative energy of the wavelets in each frequency band:

$$H = -\Sigma e_i \ln e_i.$$

Further, the root-mean-square errors of the permutation entropy, the wavelet entropy and the average described in the step 2 are $RMSE_{PE}$, $RMSE_{WE}$ and $RMSE_{AVG}$. The calculation process thereof is described by taking permutation entropy as an example: the sums of the squares of the entropy differences of all monitoring indicators are calculated and then the square root of the average value of sums of the squares is calculated to obtain the root-mean-square error of permutation entropy ($RMSE_{PE}$) of the transform before and after the last short circuit.

Further, the on-line diagnosis method for winding deformation described in the step 5 comprises the following specific steps:

Step a, a subtraction operation is carried out between voltage and current monitoring data of sample transformers and current and voltage monitoring data of all phases existing in modeling samples to construct current phase differences and voltage phase differences and the current phase differences and the voltage phase differences are added to indicators as new indicators.

Step b, the on-line monitoring data of the modeling samples are divided into two sequences. For transformers that have been subjected to short circuit, the on-line monitoring data is divided into two sequences before and after the short circuit according to the time of the last short circuit; for transformers that have not been subjected to short circuit, the sequence is equally divided into a first half and a second half.

Step c, root-mean-square errors of permutation entropy, wavelet entropy, and average of the monitoring indicators of the modeling samples in the first and second sequences are calculated.

Step d, each of feature sets of the modeling samples is added with a tag and input into an SVM model for classification learning.

Step e, hierarchical cross-validation is employed to determine the accuracy, precision, and recall of diagnosis results of the SVM model.

Step f, a feature set of each sample to be tested is calculated by using the same feature extraction method and then input into the trained SVM model, and a diagnosis result of the model for each transformer to be tested is output.

Application Example

Feature Extract

29 Root-mean-square errors of permutation entropy, wavelet entropy, and average of the monitoring indicators of modeling samples (29 transformers) in the first and second sequences are extracted to construct feature sets. Taking Transformer HB as an example, the following steps are followed to extract the feature set of the Transformer HB.

(1) According to the time of the last short circuit, Jan. 24, 2015, the feature set is divided into a sequence before the short circuit (2013 Nov. 1-2015 Jan. 24) and a sequence after the short circuit (2015 Jan. 24-2015 Aug. 13): $T_{before}$ and $T_{after}$.

(2) All indicators are transformed into an interval [0,1] by the maximum and minimum normalization formula $$x^* = \frac{x - x_{min}}{x_{max} - x_{min}}$$

to be dimensioned.

(3) The permutation entropy (PE), wavelet entropy (WE), and average (AVG) of the monitoring indicators after screening and reconstruction in the two sequences are calculated. The average is represented by the arithmetic average of the monitoring indicator in all observations.

Figure 2:
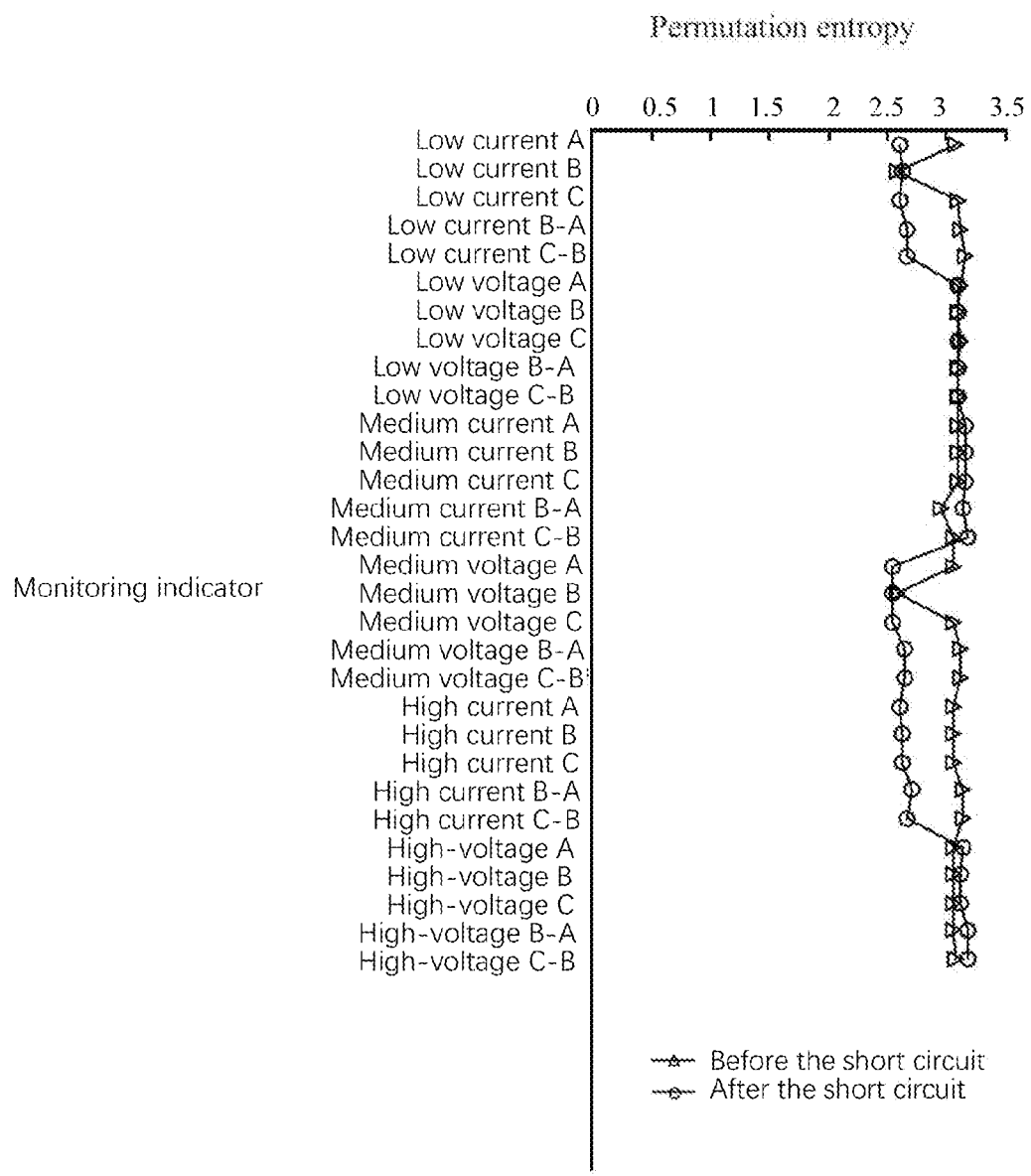
FIG. 2 is a diagram showing changes in permutation entropy of each monitoring indicator of Transformer HB (deformed) before and after a short circuit in an application example of the present invention.
Figure 3:
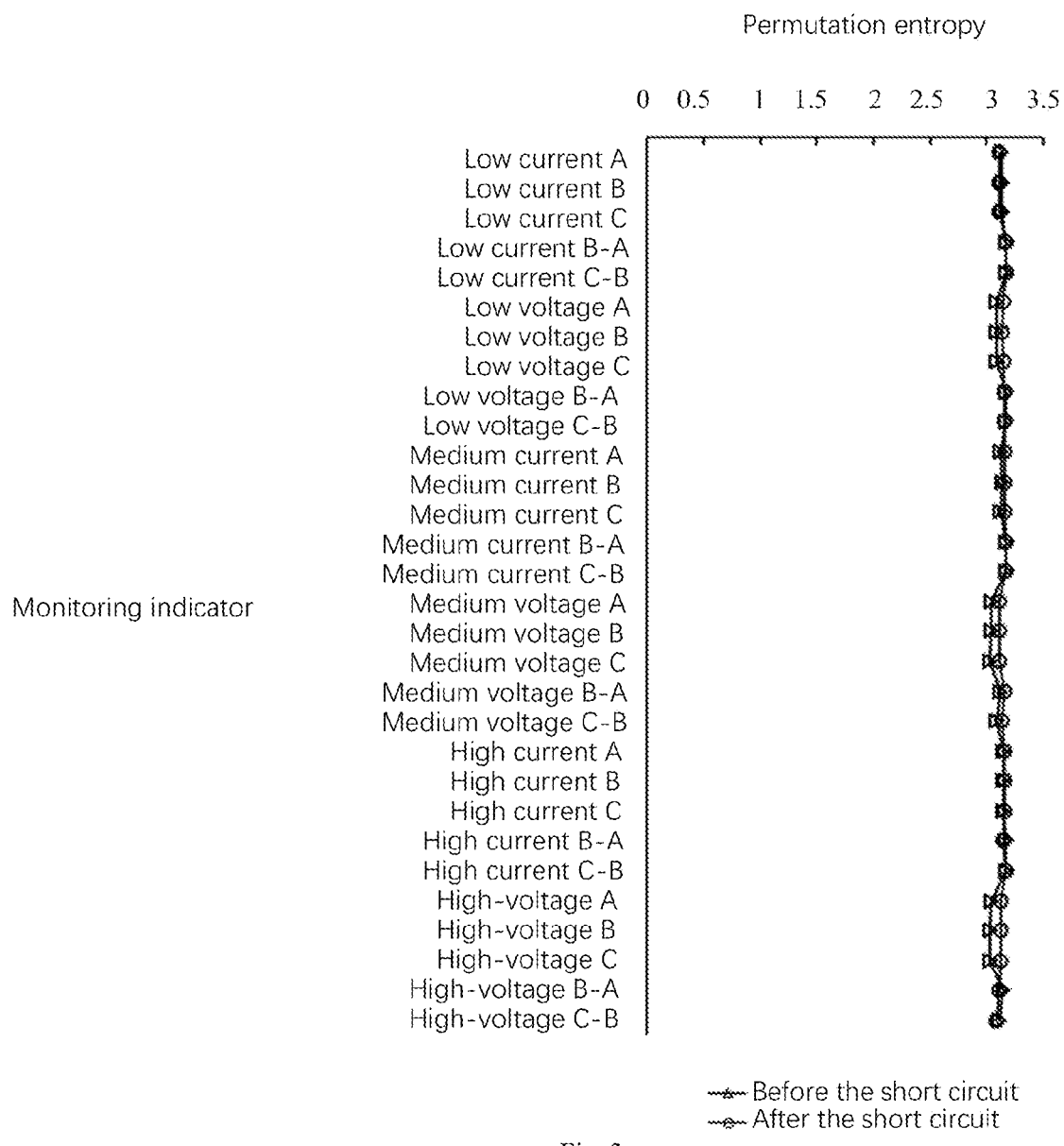
FIG. 3 is a diagram showing changes in permutation entropy of each monitoring indicator of Transformer FM (not deformed) before and after a short circuit in the application example of the present invention.

By comparing a transformer (Transformer HB) which is deformed after a short circuit and a transformer (Transformer FM) which is not deformed after a short circuit, as shown in FIG. 2 and FIG. 3, the permutation entropy values of most of the monitoring indicators of Transformer HB in the sequences before and after the short circuit are significantly different, while all monitoring indicators of the Transformer FM before and after the short circuit are approximately equal.

SVM and Hierarchical Cross-Validation

Each of feature sets of the modeling samples is added with a tag indicating whether deformation occurs and then input into an SVM model for classification learning. Then, based on a cross-validation method, by sequentially selecting one set as a test set and the other two sets as training sets, the test set and the training sets are input into the SVM, and then the test result can be output.

Feature Extraction for Position Subsamples

The main operation in diagnosis of the specific position of winding deformation is feature extraction for position subsamples. Among six deformed transformers, only three transformers, Transformer HB, Transformer WT, and Transformer XX, have clearly shown the position where deformation occurs and the position where no deformation occurs inside the transformers. The three transformers are each divided into nine position subsamples according to a three-phase three-winding pattern to form 27 new position subsamples, which are used as modeling samples for position diagnosis. The root-mean-square errors of normalized permutation entropy, wavelet entropy and average of subordinate monitoring indicators of each position subsample in two sequences before and after the short circuit are calculated to construct features sets.

Figure 4:
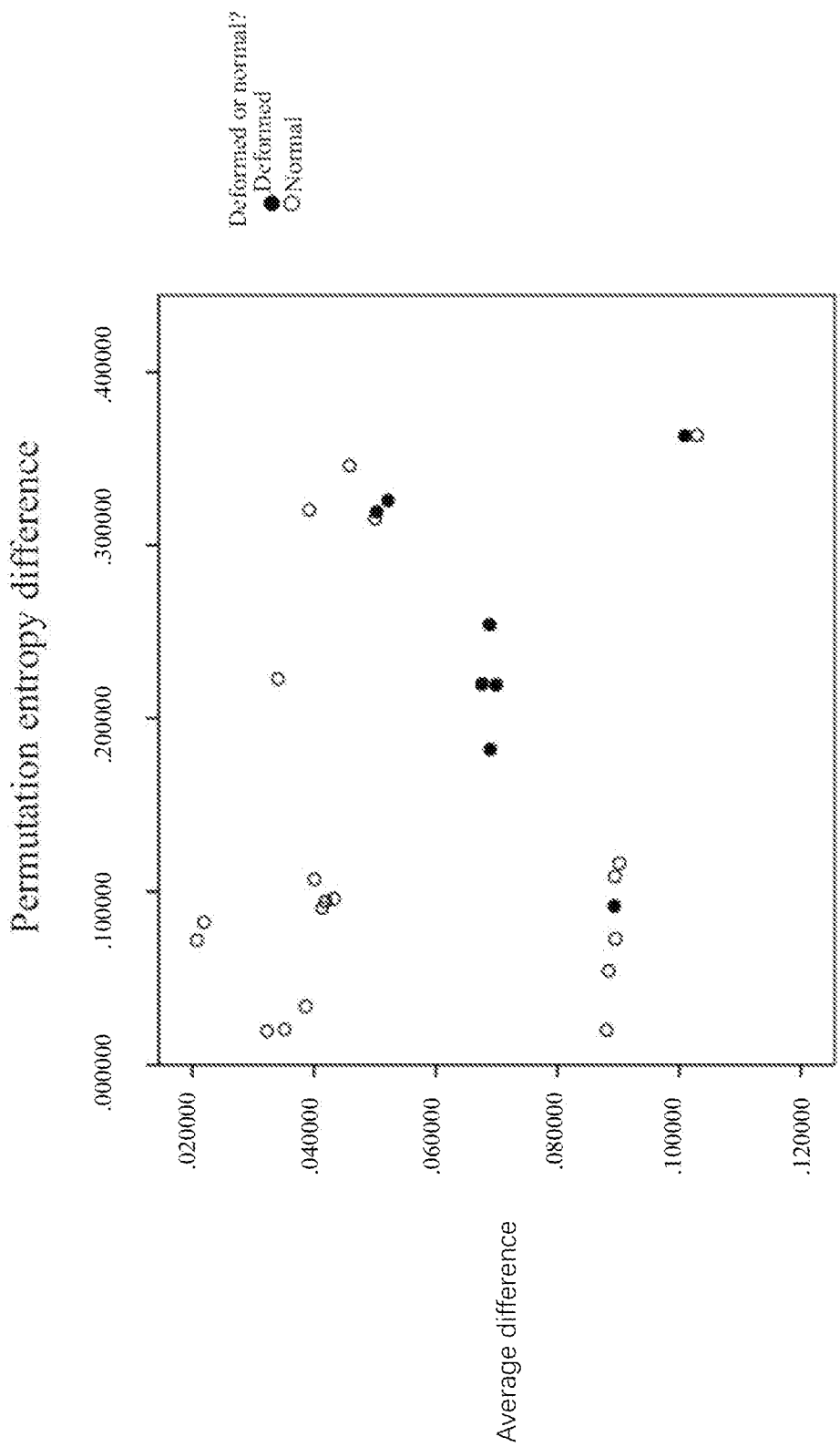
FIG. 4 is a two-dimensional scatter plot of position subsamples in the application example of the present invention.

The two-dimensional scatter plot of the permutation entropy difference (the root-mean-square error of the permutation entropy of the monitoring indicator in the sequences before and after the short circuit) and the average difference (the root-mean-square error of the average of the monitoring indicator in the sequences before and after the short circuit) is plotted as shown in FIG. 4, and the deformed position subsamples (hollow circles in the figure) are mostly gathered in the upper right corner of the plot, while the normal position subsamples (the solid circles in the figure) are mostly gathered in the lower left corner of the plot, indicating that the difference between the sequences before and after the short circuit of the deformed samples are larger than that of the normal samples. That is, the deformation causes the changes in permutation entropy and average of each monitoring indicator.

The invention claimed is:

1. An intelligent on-line diagnosis and positioning method for winding deformation of power transformers, comprising:

step 1: dividing on-line monitoring indicators of each of n known transformers at deformation positions according to a three-phase three-winding pattern into 9 position subsamples as modeling samples for positioning diagnosis;

step 2: calculating root-mean-square errors of normalized permutation entropy, wavelet entropy and average of subordinate monitoring indicators of the 9n position subsamples in two sequences before and after a last short circuit to construct features sets;

step 3: adding to the feature set of each of the 9n position subsamples a tag indicating whether deformation occurs and then inputting into a Support Vector Machine (SVM) model for classification learning to obtain a trained SVM model;

step 4: carrying out hierarchical cross-validation to determine accuracy, precision, and recall of diagnosis results of the model; and step 5: in the case of determining the deformation positioning of a sample to be tested, first carrying out an on-line winding deformation diagnosis method to conclude that the transformer to be tested is deformed, and then dividing on-line monitoring indicators of the transformer to be tested according to a three-phase three-winding pattern into 9 position subsamples, calculating a feature set in the same way as in step 2, inputting the feature set into the trained SVM model, and outputting a diagnosis result of the SVM model for each position subsample.

2. The intelligent on-line diagnosis and positioning method for winding deformation of power transformers according to claim 1, wherein in the step 1, the 9 positions are high-voltage phase A, high-voltage phase B, high-voltage phase C, medium-voltage phase A, medium-voltage phase B, medium-voltage phase C, low-voltage phase A, low-voltage phase B and low-voltage phase C, respectively.

3. The intelligent on-line diagnosis and positioning method for winding deformation of power transformers according to claim 1, wherein in the step 1, the on-line monitoring indicators include voltage and current monitoring data and 12 new phase difference indicators constructed by a three-phase unbalance rate, totaling 30 indicators; and with respect to the phase difference indicators, as an example, the current and voltage phase differences at a low-voltage side are calculated according to the formulas as follows, and the current and voltage phase differences at a medium-voltage side and a high-voltage side are calculated in the same way:

current difference between low-voltage phases $A$ and $B$=current amplitude of low-voltage phase $B$−current amplitude of low-voltage phase $A$, current difference between low-voltage phases $B$ and $C$=current amplitude of low-voltage phase $C$−current amplitude of low-voltage phase $B$, voltage difference between low-voltage phases $A$ and $B$=voltage amplitude of low-voltage phase $B$−voltage amplitude of low-voltage phase $A$, and voltage difference between low-voltage phases $B$ and $C$=voltage amplitude of low-voltage phase $C$−voltage amplitude of low-voltage phase $B$.

4. The intelligent on-line diagnosis and positioning method for winding deformation of power transformers according to claim 1, wherein the permutation entropy in the step 2 is calculated in a way that a phase space reconstruction delay coordinate method is employed to reconstruct the phase space of any one element x(i) in a one-dimensional time sequence x to obtain the following matrix:

$$\begin{bmatrix} x(1) & x(1+\tau) & \ldots & x(1+(m-1)\tau) \\ \ldots & \ldots & \ldots & \ldots \\ x(j) & x(j+\tau) & \ldots & x(j+(m-1)\tau) \\ \ldots & \ldots & \ldots & \ldots \\ x(K) & x(K+\tau) & \ldots & x(K+(m-1)\tau) \end{bmatrix}$$

in the formula, m is an embedding dimension, and τ is delay time; the elements of the reconstructed vector of x(i) are arranged in ascending order, $j_1, j_2, \ldots j_m$; and at most m! different arrangement patterns are obtained under the m-dimension phase space mapping, one of the arrangement patterns is represented by P(l), $$P(l)=(j_1, j_2, \ldots, j_m),$$

then, the number of occurrence of the various arrangements of the sequence x are then counted to calculate the relative frequency $P_i$ of each arrangement:

$$P_i = \frac{\text{the number of } P(l)}{k},$$

then, the entropy of a signal arrangement pattern is expressed as:

$$H=-\Sigma_{i=1}^{k} P_i \ln P_i,$$

and then the normalized permutation entropy is expressed as:

$$H(m, \tau) = \frac{\left(-\sum_{i=1}^{k} P_i \ln P_i\right)}{\ln(m!)}.$$

5. The intelligent on-line diagnosis and positioning method for winding deformation of power transformers according to claim 1, wherein the wavelet entropy in the step 2 is calculated by the algorithm in which a signal f(n) is continuously subdivided through different filters and decomposed into sub-signals at different measures (M), including a series of frequency binary division based high-frequency detail sub-band signals $D_1, D_2, \ldots, D_M$ and a low-frequency approximation sub-band signal $A_M(n)$; after the wavelet decomposition of the signal, the wavelet energy $E_1, E_2, \ldots, E_n$ in each frequency band (i=1, 2, . . . , n) can be obtained; based on energy conservation before and after wavelet transform, the total power E of the signal in a certain time window is equal to the sum of component powers; the total energy entropy is equal to the sum of information entropy of the relative energy of the wavelets in each frequency band:

$$H=-\Sigma e_i \ln e_i.$$

6. The intelligent on-line diagnosis and positioning method for winding deformation of power transformers according to claim 1, wherein the root-mean-square errors of the permutation entropy, the wavelet entropy and the average described in the step 2 are $RMSE_{PE}$, $RMSE_{WE}$ and $RMSE_{AVG}$; the calculation process of the root-mean-square error of permutation entropy is described as an example as follows: the sums of the squares of the entropy differences of all monitoring indicators are calculated and then the square root of the average value of sums of the squares is calculated to obtain the root-mean-square error of permutation entropy ($RMSE_{PE}$) of the transform before and after the last short circuit.

7. The intelligent on-line diagnosis and positioning method for winding deformation of power transformers according to claim 1, wherein the on-line diagnosis method for winding deformation described in the step 5 comprises the following steps:

step a: carrying out a subtraction operation between voltage and current monitoring data of sample transformers and current and voltage monitoring data of all phases existing in modeling samples to construct current phase differences and voltage phase differences and adding the current phase differences and the voltage phase differences as new indicators to indicators;

step b: dividing the on-line monitoring data of the modeling samples into two sequences: for transformers that have been subjected to short circuit, dividing the on-line monitoring data into two sequences before and after the short circuit according to the time of the last short circuit; for transformers that have not been subjected to short circuit, equally dividing the sequence into a first half and a second half.

step c: calculating root-mean-square errors of permutation entropy, wavelet entropy, and average of the monitoring indicators of the modeling samples in the first and second sequences;

step d: adding a tag to each of feature sets of the modeling samples and inputting into an SVM model for classification learning to obtain a trained SVM model;

step e: carrying out hierarchical cross-validation to determine the accuracy, precision, and recall of diagnosis results of the SVM model; and step f: calculating a feature set of each sample to be tested by using the same feature extraction method, inputting into the trained SVM model, and outputting a diagnosis result of the model for each transformer to be tested.

* * * * *